(12) United States Patent
Lin et al.

(10) Patent No.: US 9,883,595 B2
(45) Date of Patent: Jan. 30, 2018

(54) SUBSTRATE STRUCTURES AND METHODS OF MANUFACTURE

(71) Applicant: SEMICONDUCTOR COMPONENTS INDUSTRIES, LLC, Phoenix, AZ (US)

(72) Inventors: Yusheng Lin, Phoenix, AZ (US); Sadamichi Takakusaki, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/206,574

(22) Filed: Jul. 11, 2016

(65) Prior Publication Data

US 2016/0324008 A1    Nov. 3, 2016

Related U.S. Application Data

(62) Division of application No. 14/534,482, filed on Nov. 6, 2014, now Pat. No. 9,408,301.

(51) Int. Cl.
*H01L 23/14* (2006.01)
*H01L 21/48* (2006.01)
(Continued)

(52) U.S. Cl.
CPC .............. *H05K 3/06* (2013.01); *C04B 37/021* (2013.01); *H01L 21/4857* (2013.01);
(Continued)

(58) Field of Classification Search
CPC .......... H05K 1/036; H05K 1/05; H05K 1/053; H05K 1/056; H01L 23/142; H01L 21/4871
See application file for complete search history.

(56) References Cited

U.S. PATENT DOCUMENTS 5,362,926 A * 11/1994 Fukuda ................. H01L 23/053
174/256
6,259,157 B1   7/2001 Sakamoto et al.
(Continued)

FOREIGN PATENT DOCUMENTS

DE   102009033029 A1   1/2011
DE   102012206758 B3   5/2013
JP   1999-027470       1/1999
JP   2003-318334       11/2003
(Continued)

*Primary Examiner* — Robert Bachner
*Assistant Examiner* — Molly Reida
(74) *Attorney, Agent, or Firm* — IPTechLaw

(57) ABSTRACT

A power electronic substrate includes a metallic baseplate having a first and second surface opposing each other. An electrically insulative layer also has first and second surfaces opposing each other, its first surface coupled to the second surface of the metallic baseplate. A plurality of metallic traces each include first and second surfaces opposing each other, their first surfaces coupled to the second surface of the electrically insulative layer. At least one of the metallic traces has a thickness measured along a direction perpendicular to the second surface of the metallic baseplate that is greater than a thickness of another one of the metallic traces also measured along a direction perpendicular to the second surface of the metallic baseplate. In implementations the electrically insulative layer is an epoxy or a ceramic material. In implementations the metallic traces are copper and are plated with a nickel layer at their second surfaces.

5 Claims, 10 Drawing Sheets

(51) Int. Cl.

| | |
|---|---|
| *H05K 1/05* | (2006.01) |
| *H05K 3/06* | (2006.01) |
| *H05K 1/03* | (2006.01) |
| *H05K 1/09* | (2006.01) |
| *H05K 3/46* | (2006.01) |
| *H05K 3/00* | (2006.01) |
| *H01L 23/15* | (2006.01) |
| *C04B 37/02* | (2006.01) |

(52) U.S. Cl.
CPC ........ H01L 21/4871 (2013.01); H01L 23/142 (2013.01); H01L 23/15 (2013.01); H05K 1/0306 (2013.01); H05K 1/036 (2013.01); H05K 1/0313 (2013.01); H05K 1/056 (2013.01); H05K 1/09 (2013.01); H05K 3/0011 (2013.01); H05K 3/064 (2013.01); H05K 3/4644 (2013.01); *C04B 2237/34* (2013.01); *C04B 2237/343* (2013.01); *C04B 2237/402* (2013.01); *C04B 2237/406* (2013.01); *C04B 2237/407* (2013.01); *C04B 2237/52* (2013.01); *C04B 2237/64* (2013.01); *C04B 2237/82* (2013.01); *H01L 2924/0002* (2013.01)

(56) References Cited

U.S. PATENT DOCUMENTS

| | | | |
|---|---|---|---|
| 6,593,169 | B2 | 7/2003 | Iimura et al. |
| 7,078,797 | B2 | 7/2006 | Suzuki et al. |
| 7,102,211 | B2 | 9/2006 | Ochiai et al. |
| 7,186,921 | B2 | 3/2007 | Igarashi et al. |
| 7,221,049 | B2 | 5/2007 | Igarashi et al. |
| 7,232,957 | B2 | 6/2007 | Mizutani et al. |
| 7,253,027 | B2 | 8/2007 | Kanakubo |
| 7,315,083 | B2 | 1/2008 | Igarashi et al. |
| 7,491,894 | B2 | 2/2009 | Suzuki et al. |
| 7,521,290 | B2 | 4/2009 | Takakusaki et al. |
| 7,714,232 | B2 | 5/2010 | Igarashi et al. |
| 7,935,899 | B2 | 5/2011 | Takukusaki et al. |
| 7,936,569 | B2 | 5/2011 | Takakusaki et al. |
| 7,957,158 | B2 | 6/2011 | Takakusaki et al. |
| 8,749,052 | B2 | 6/2014 | Schulz-Harder et al. |
| 2005/0263320 | A1* | 12/2005 | Igarashi ............ H01L 23/538 174/255 |
| 2012/0134115 | A1 | 5/2012 | Schulz-Harder |

FOREIGN PATENT DOCUMENTS

| | | |
|---|---|---|
| JP | 2006-237561 | 9/2006 |
| JP | 2007-036013 | 2/2007 |
| JP | 2008-022033 | 2/2008 |

* cited by examiner

SUBSTRATE STRUCTURES AND METHODS OF MANUFACTURE

CROSS REFERENCE TO RELATED APPLICATIONS

This application is a divisional application of the earlier U.S. Utility patent application to Lin et al. entitled "Substrate Structures and Methods of Manufacture," application Ser. No. 14/534,482, filed Nov. 6, 2014, now pending, the disclosure of which is hereby incorporated entirely herein by reference.

BACKGROUND

1. Technical Field

Aspects of this document relate generally to substrate structures for semiconductor integrated circuit components. More specific implementations involve substrate structures for power modules.

2. Background Art

Substrate structures for semiconductor integrated circuits, such as power modules, are used to route components internal and external to an integrated circuit and to dissipate heat. Direct bonded copper (DBC) substrates include a ceramic layer with a layer of copper bonded to one or both sides. Insulated metal substrate (IMS) substrates include a metal baseplate covered by a thin layer of dielectric (usually an epoxy-based layer) and a layer of copper.

SUMMARY

Implementations of power electronic substrates may include: a metallic baseplate having a first surface and a second surface opposing the first surface; an electrically insulative layer having a first surface coupled to the second surface of the metallic baseplate, the electrically insulative layer having a second surface opposing the first surface of the electrically insulative layer; a plurality of metallic traces, each metallic trace coupled to the second surface of the electrically insulative layer at a first surface of the metallic trace, each metallic trace having a second surface opposing the first surface of the metallic trace; wherein at least one of the metallic traces has a thickness measured along a direction perpendicular to the second surface of the metallic baseplate that is greater than a thickness of another one of the metallic traces also measured along a direction perpendicular to the second surface of the metallic baseplate.

Implementations of power electronic substrates may include one, all, or any of the following:

At least one of the metallic traces may have two thicknesses of different magnitudes measured along a direction perpendicular to the second surface of the metallic baseplate.

Each of the plurality of metallic traces may include copper.

Each of the metallic traces may include a layer of nickel plated onto the second surface of the metallic trace.

The electrically insulative layer may include an epoxy.

Implementations of methods of forming an insulated metal substrate (IMS) for a power electronic may include: partially etching a first surface of a copper layer to form a pattern having a first thickness and a second thickness greater than the first thickness, the first thickness and the second thickness both measured perpendicular to a second surface of the copper layer opposite the first surface of the copper layer; laminating the first surface of the copper layer with a second surface of a dielectric layer, the dielectric layer coupled to a metallic baseplate at a first surface of the dielectric layer opposite the second surface of the dielectric layer and at a second surface of the metallic baseplate; and forming traces in the copper layer by etching through the copper layer at the first thickness and etching through the copper layer at the second thickness, wherein the traces have two different trace thicknesses, where the trace thicknesses are measured perpendicularly to the first surface of the dielectric layer.

Implementations of methods of forming an IMS for a power electronic may include one, all, or any of the following:

Forming the pattern may further include forming a third thickness different in magnitude from the first thickness and the second thickness, the third thickness measured perpendicular to the first surface of the dielectric layer.

Plating a layer of nickel onto the second surface of the copper layer, wherein forming the traces in the copper layer further includes etching through the layer of nickel.

Etching through the copper layer at the first thickness and etching through the copper layer at the second thickness may include coupling a first layer of photoresist to the second surface of the copper layer, forming a pattern in the first layer of photoresist, etching through the copper layer at the first thickness at spaces in the pattern in the first layer of photoresist, removing the first layer of photoresist, coupling a second layer of photoresist to the second surface of the copper layer, forming a pattern in the second layer of photoresist, etching through the copper layer at the second thickness at the spaces in the pattern in the second layer of photoresist, and removing the second layer of photoresist.

Laminating the traces in the copper layer with a second dielectric layer, coupling a second copper layer to the second dielectric layer, and forming traces in the second copper layer to form a stacked IMS for a power electronic.

Implementations of methods of forming a direct bonded copper (DBC) substrate for a power electronic may include: coupling a first surface of a ceramic layer to a second surface of a metallic baseplate, the ceramic layer having a second surface opposing the first surface; coupling a first surface of a copper layer with the second surface of the ceramic layer, the first surface of the copper layer having a pattern including a first thickness and a second thickness greater than the first thickness, the first thickness and the second thickness both measured perpendicularly to the first surface of the ceramic layer; and forming traces in the copper layer by etching through the copper layer at the first thickness and etching through the copper layer at the second thickness, wherein the traces include two different trace thicknesses, where the trace thicknesses are measured perpendicularly to the first surface of the ceramic layer.

Implementations of methods of forming a DBC may include one, all, or any of the following:

The second surface of the ceramic layer may include a pattern complementary to the pattern of the first surface of the copper layer.

Plating a layer of nickel onto the second surface of the copper layer, wherein forming traces in the copper layer includes etching through the layer of nickel.

Etching through the copper layer at the first thickness and etching through the copper layer at the second thickness may include coupling a first layer of photoresist to the second surface of the copper layer, forming a pattern in the first layer of photoresist, etching the copper layer at the first thickness at a space in the pattern in the first layer of photoresist, removing the first layer of photoresist, coupling a second layer of photoresist to the second surface of the copper layer, forming a pattern in the second layer of photoresist, etching the copper layer at the second thickness at a space in the pattern in the second layer of photoresist, and removing the second layer of photoresist.

Implementations of power electronic substrates may include: a dielectric layer having a first surface and a second surface opposing the first surface; a ceramic layer having a bonding pattern on a second surface of the ceramic layer, the second surface of the ceramic layer laminated with the first surface of the dielectric layer, the first surface of the dielectric layer configured to receive the bonding pattern of the second surface of the ceramic layer; and a plurality of copper traces, each copper trace coupled to the dielectric layer at the second surface of the dielectric layer and at a first surface of the copper trace.

The dielectric layer may include an epoxy.

Implementations of power electronic substrates may include one, all, or any of the following:

A first surface of the ceramic layer may include a bonding pattern, the first surface of the ceramic layer may be laminated with a second surface of a second dielectric layer, the second surface of the second dielectric layer may be configured to receive the bonding pattern of the first surface of the ceramic layer, the power electronic substrate may further have a metallic baseplate having a first surface and a second surface, the second surface of the metallic baseplate being opposite the first surface of the metallic baseplate, the second surface of the metallic baseplate being coupled to a first surface of the second dielectric layer opposing the second surface of the second dielectric layer.

The bonding pattern of the second surface of the ceramic layer may include bonding ridges.

The bonding pattern of the second surface of the ceramic layer may include one of conical and pyramidal projections.

The plurality of copper traces may include at least two trace thicknesses of different magnitudes measured along a direction substantially perpendicular to the second surface of the metallic baseplate.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended substrate structures and methods of manufacture will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such substrate structures and methods of manufacture, and implementing components and methods, consistent with the intended operation and methods.

Figure 1:
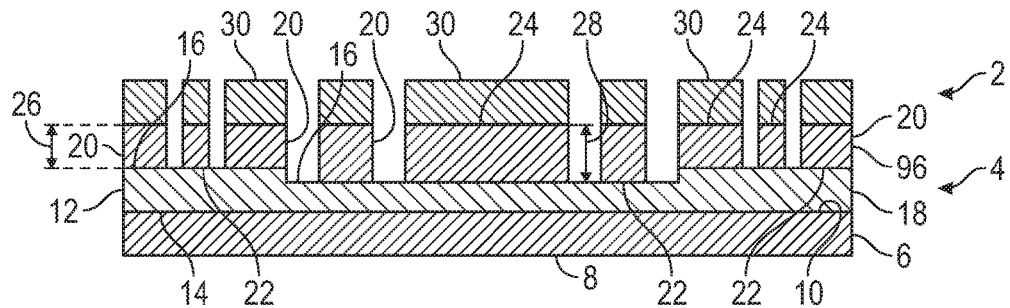
FIG. 1 is a cross-section view of an implementation of an insulated metal substrate (IMS)

Referring now to FIG. 1, an implementation of a power electronic substrate 2 is illustrated that includes an insulated metal substrate (IMS) 4. The IMS 4 has a metallic baseplate 6 which may be formed of, by non-limiting example, aluminum, copper, steel, and other heat-conducting materials. The metallic baseplate 6 has a first surface 8 which is configured to couple to, by non-limiting example, a heat sink, a motherboard, and the like. The metallic baseplate 6 has a second surface 10 on an opposite (opposing) side from the first surface 8.

A dielectric layer 12 is coupled to the metallic baseplate 6. The dielectric layer 12 has a first surface 14 which is coupled to the second surface 10 of the metallic baseplate 6 and a second surface 16 on an opposite side of the dielectric layer 12 from the first surface 14. In various implementations the dielectric layer 12 includes a resin or epoxy 18, though in other implementations it may include other dielectric (electrically insulative) materials.

Figure 7:
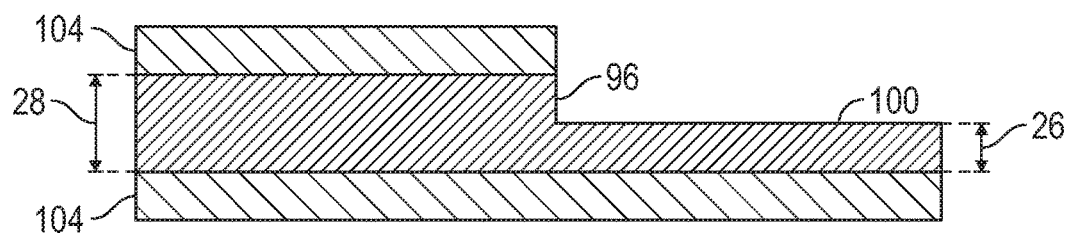
FIG. 7 is a cross-section view of the elements of FIG. 6 with a pattern etched into the copper layer.
Figure 8:
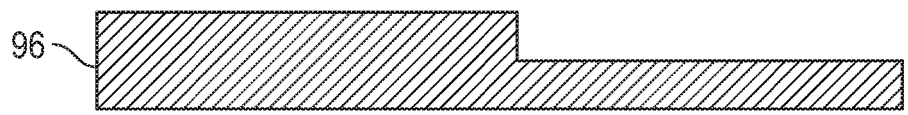
FIG. 8 is a cross-section view of the copper layer of FIG. 7 with the photoresist layers removed.
Figure 9:
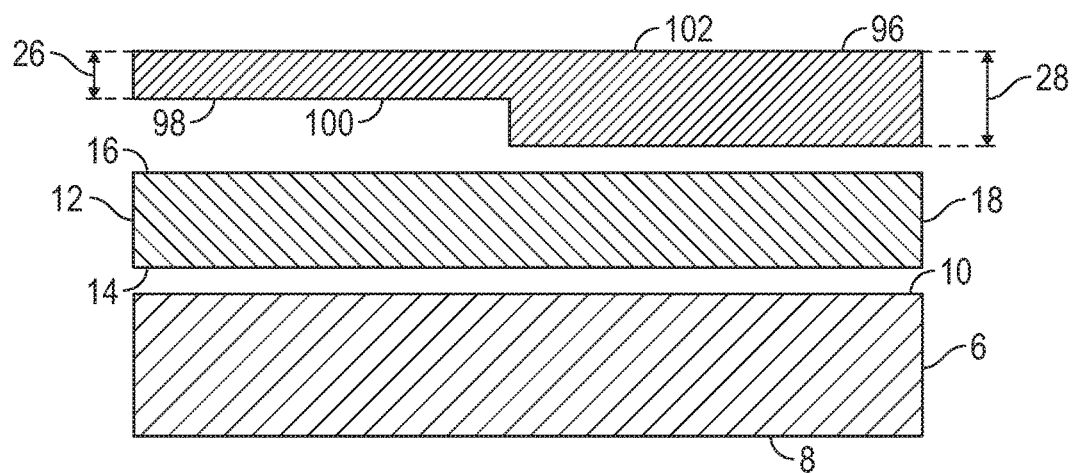
FIG. 9 is a cross-section view of the copper layer of FIG. 8, a dielectric layer and a metallic baseplate of an IMS prior to being coupled together.
Figure 17:
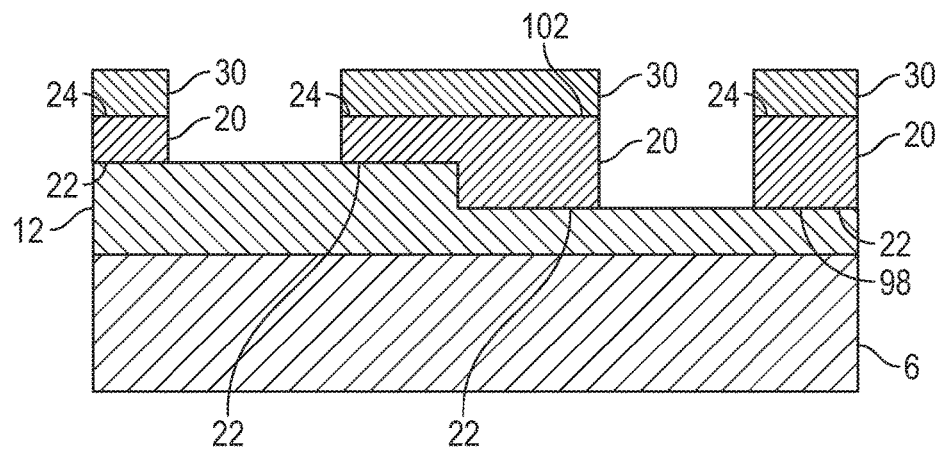
FIG. 17 is a cross-section view of the elements of FIG. 16 with the nickel plating and copper layer having been etched through at the pattern in the second layer of photoresist and the second layer of photoresist then removed.
Figure 18:
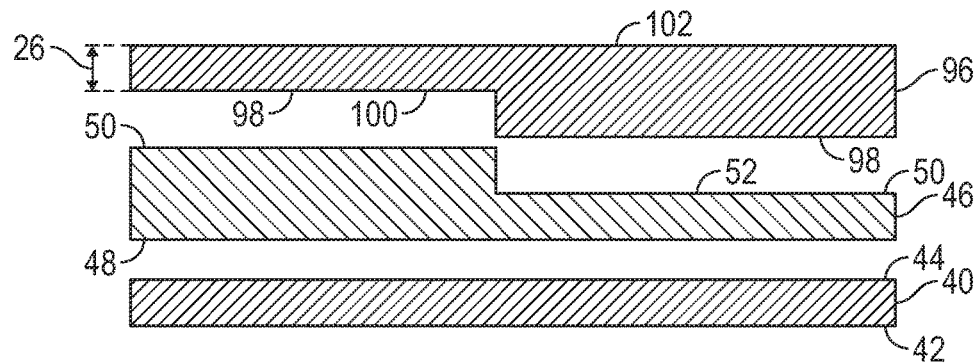
FIG. 18 is a cross-section view of the copper layer of FIG. 8 having a pattern thereon, a ceramic layer having a complementary pattern, and a metallic base plate of a DBC substrate prior to being coupled together.

A plurality of traces 20 are formed and coupled to the dielectric layer 12. Each trace 20 has a first surface 22 coupled to the second surface 16 of the dielectric layer 12 and a first surface 22 on an opposite side of the trace 20 from the first surface 22. The traces 20 are metallic and may be formed of, by non-limiting example, copper, aluminum, or other electrically conductive materials. Some of the traces 20 have a first thickness 26, measured from the first surface 22 to the second surface 24, and some of the traces 20 have a second thickness 28, greater than the first thickness 26, measured from the first surface 22 to the second surface 24. In some implementations there could be traces 20 having a third thickness sized differently from both the first thickness 26 and second thickness 28 or other traces that contain both the first thickness and the second thickness. Referring to FIGS. 7-9, the difference in thicknesses is created at least in part by a pattern 100 which is formed in a first surface 98 of a copper layer 96 from which the traces 20 are formed, which will be discussed hereafter, and the traces 20 which have the smaller first thickness 26 correspond with the pattern 100 or, in other words, are located at the pattern 100 or formed of the material that composes the pattern 100. Referring back to FIG. 1, a layer of nickel 30 is included on the second surface 24 of each metallic trace 20. In implementations a single trace 20 may have different thicknesses in different places and so may include the first thickness 26, second thickness 28, a third thickness, and so on. A trace 20 of this nature is illustrated in FIG. 17.

Figure 2:
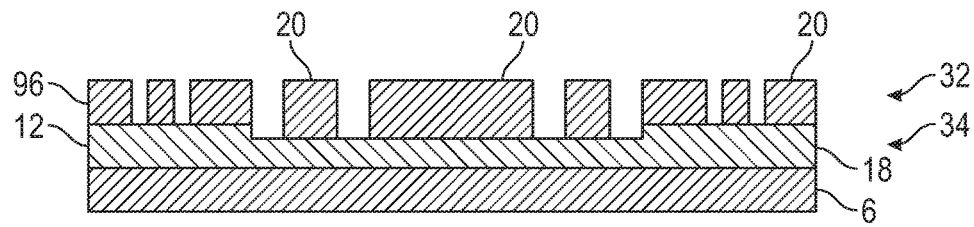
FIG. 2 is a cross-section view of another implementation of an IMS.

Referring now to FIG. 2, in particular implementations a power electronic substrate 32 is an IMS 34 that is similar in structure to IMS 4 except the traces lack the nickel 30 atop the traces 20.

Figure 3:
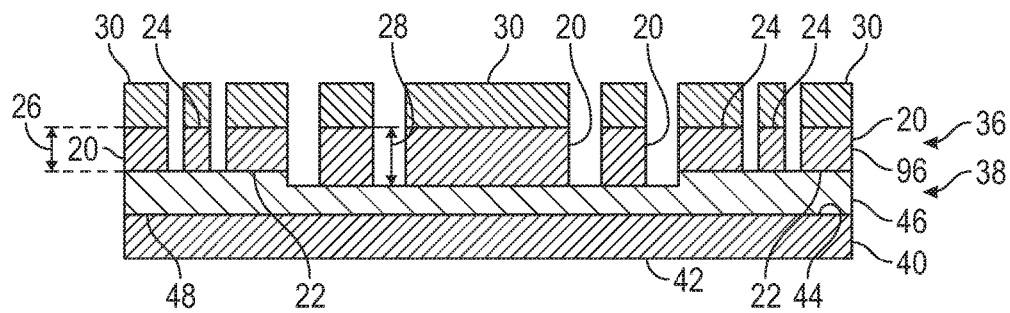
FIG. 3 is a cross-section view of an implementation of a direct bonded copper (DBC) substrate.
Figure 4:
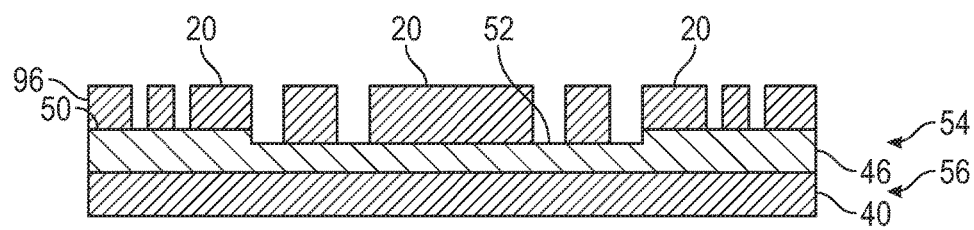
FIG. 4 is a cross-section view of another implementation of a DBC substrate.
Figure 5:
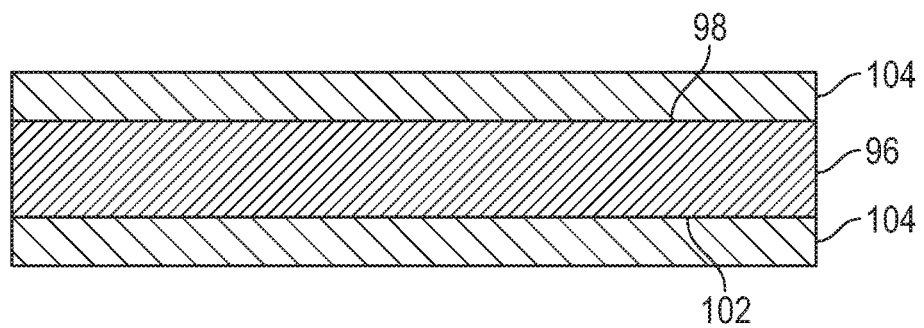
FIG. 5 is a cross-section view of a copper layer having photoresist layers thereon

Referring now to FIGS. 3 and 4, implementations of a power electronic substrate 36 that are direct bonded copper (DBC) substrates are illustrated. The DBC substrate 38 has a metallic baseplate 40 which may be formed of, by non-limiting example, copper, aluminum, steel, and the like. The metallic baseplate 40 has a first surface 42 configured to be coupled to, by non-limiting example, a heat sink, a motherboard, and the like, and further has a second surface 44 on an opposite side of the metallic baseplate 40 from the first surface 42. A first surface 48 of a ceramic layer 46 is coupled to the second surface 44 of the metallic baseplate 40. The ceramic layer 46 has a second surface 50 on an opposite side of the ceramic layer 46 from the first surface 48. A pattern 52 is formed in the second surface 50 of the ceramic layer 46 which may be formed, by non-limiting example, with a number of patterning techniques used to etch and shape ceramic materials. The ceramic layer 46 may be half-etched, though in implementations the etching may go more or less than halfway through the ceramic layer 46. The etching may be accomplished through wet-etching techniques. In other implementations, the ceramic layer 46 may be patterned through printing, molding, or stamping when the ceramic material is still soft and pliable before curing, firing, or sintering of the layer has taken place.

The DBC substrate 38 has a plurality of traces 20 similar to IMS 4. The traces 20 having the larger second thickness 28, measured between the first surface 22 and second surface 24, correspond with the pattern 52, or in other words are located at or formed from the pattern 52. A layer of nickel 30 is placed atop each trace 20, similar to IMS 4. which may be plated onto the traces 20.

Referring now to FIG. 4, in implementations a power electronic substrate 54 is a DBC substrate 56 that is similar to DBC substrate 38 except it lacks the nickel layer 30.

Figure 6:
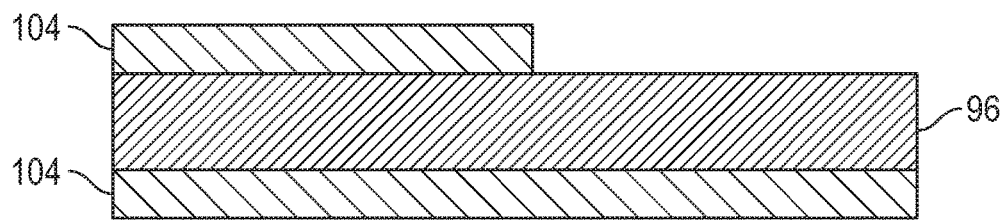
FIG. 6 is a cross-section view of the elements of FIG. 5 with a pattern formed in one of the photoresist layers.

Referring now to FIGS. 5-17, a method of forming an IMS 4 is illustrated. A copper layer 96 is first processed where the copper layer 96 has a first surface 98 and a second surface 102 on an opposite side of the copper layer 96 from the first surface 98. A layer of photoresist 104 is placed on the first surface 98 and another layer of photoresist 104 is placed on the second surface 102. A pattern is formed in the photoresist 104 on the first surface 98, as seen in FIG. 6. This may be done by exposing a portion of the photoresist 104 to ultraviolet (UV) light or other exposure techniques which make a portion of the photoresist 104 more resistant (or more susceptible) to being removed, and then developing the photoresist 104 with a solution that removes the treated (or untreated) portion to form the pattern.

While only a single part of the pattern is shown, it may be understood that FIG. 6 is a close-up view of only a portion of the elements, and that in reality a pattern of traces and other shapes may be formed in the photoresist 104. An etching process is then used to etch a pattern 100 into the first surface 98 of the copper layer 96 through the spaces formed in the photoresist 104. This may be done using any conventional etching mechanisms used to etch copper. The formation of the pattern 100 forms locations of the copper layer 96 that have the first thickness 26 and other locations that have the second thickness 28, the smaller first thickness 26 corresponding with the patterned areas where the first surface 98 has been etched. It can be seen from FIG. 7 that the etching of the copper layer 96 is a partial etch which does not go all the way through to the second surface 102. In some implementations, the etching may be half-etched. In other implementations, the pattern 100 may be etched more or less than halfway through the copper layer 96.

Referring now to FIG. 8, after the pattern 100 has been etched into the first surface 98 the layers of photoresist 104 are removed. It may be understood that the layer of photoresist 104 that was placed on the second surface 102 is used to prevent the second surface 102 from being etched during the etching process—such as, for instance, in cases where the etching was done with wet etching where the entire copper layer 96 was placed in an etching solution. Any of a wide variety of conventional methods for removing the photoresist 104 (ashing, solvent cleaning, etc.) may be employed in various implementations.

Referring now to FIG. 9, a metallic baseplate 6 is illustrated that has a first surface 8 and second surface 10 as previously described. A dielectric layer 12 having first surface 14 and second surface 16 is also provided, which in the implementation shown includes an epoxy 18. The copper layer 96 is positioned so that its first surface 98 faces the second surface 16 of the dielectric layer 12.

Figure 10:
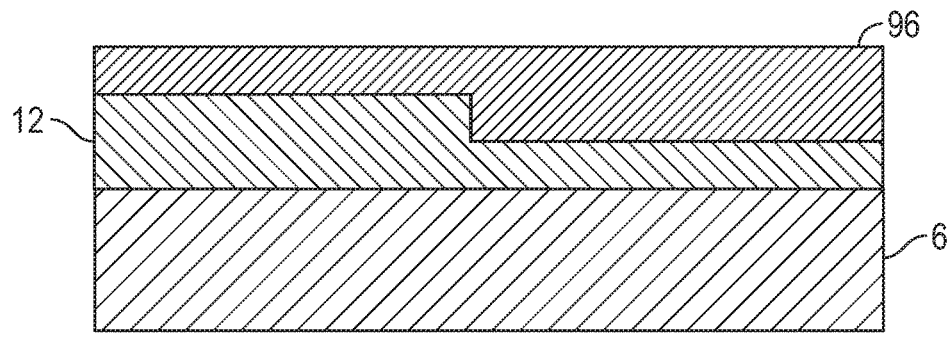
FIG. 10 is a cross-section view of the elements of FIG. 9 coupled together.

Referring now to FIG. 10, the copper layer 96, dielectric layer 12, and metallic baseplate 6 are illustrated after having been coupled together through a laminating or other pressure bonding process that presses the layers together. During the bonding step, the dielectric layer 12 flows under the pressure forces during this step of assembly and accommodates the pattern 100, as seen in FIG. 10, embedding the pattern 100 into the dielectric layer 12. This bonding/laminating step forms a complementary, or substantially complementary pattern, to the pattern 100 in the dielectric layer 12.

Figure 11:
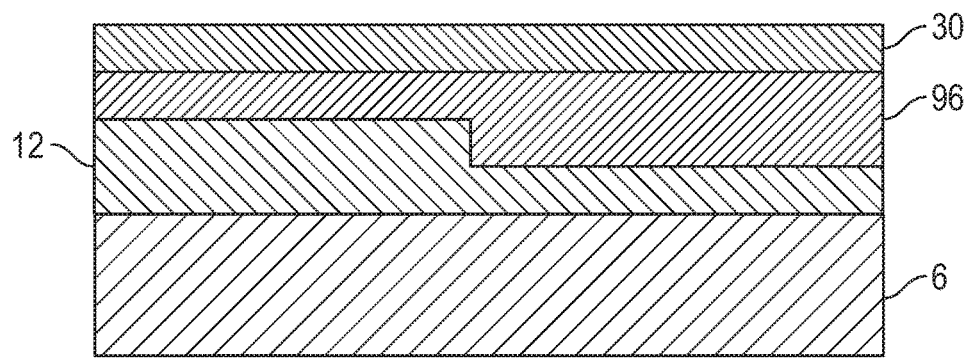
FIG. 11 is a cross-section view of the elements of FIG. 10 with nickel plating atop the copper layer.
Figure 12:
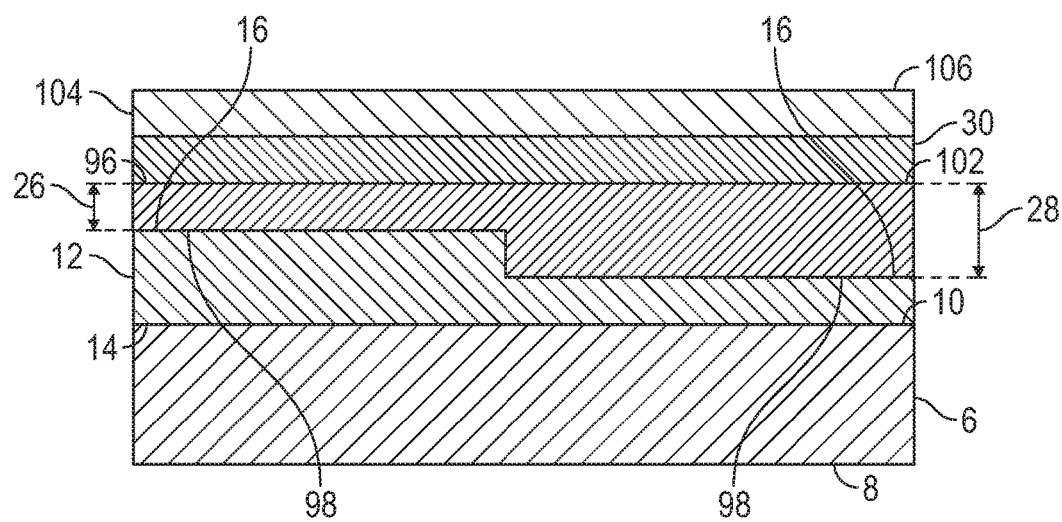
FIG. 12 is a cross-section view of the elements of FIG. 11 with a first layer of photoresist placed atop the nickel plating.
Figure 13:
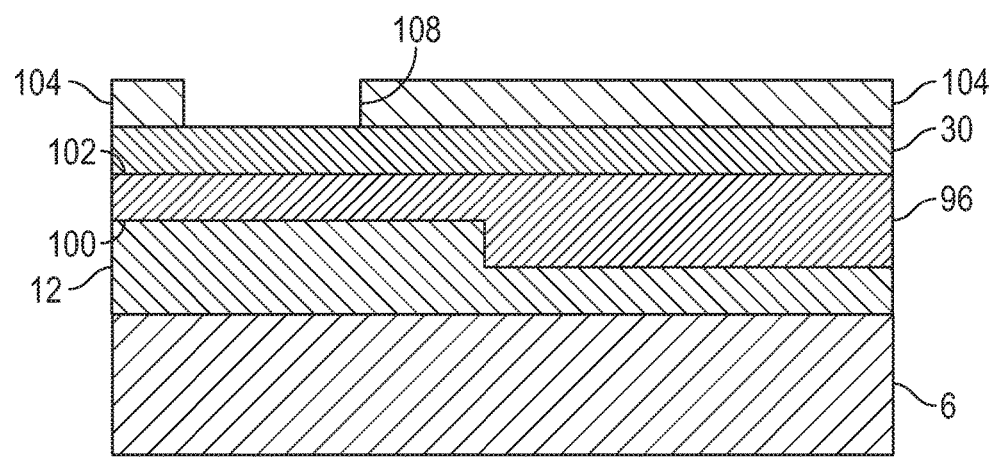
FIG. 13 is a cross-section view of the elements of FIG. 12 with a pattern formed in the layer of photoresist.
Figure 14:
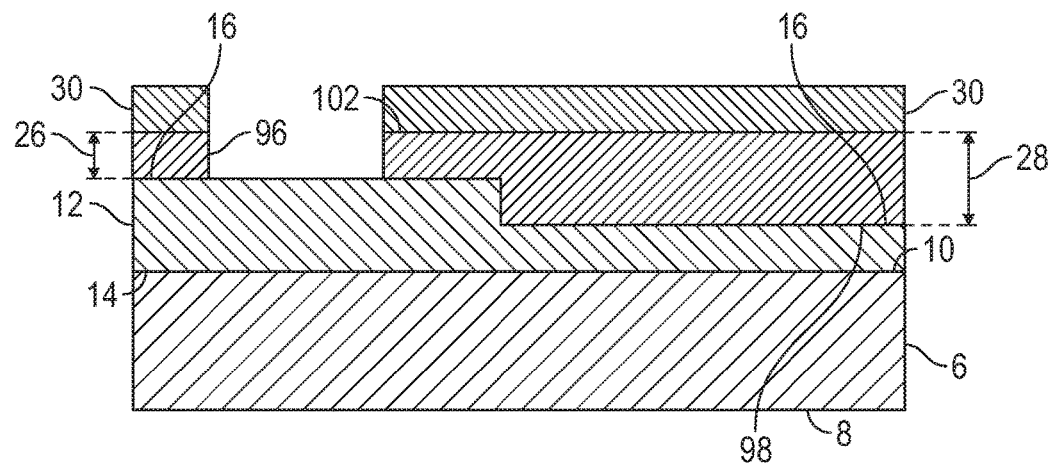
FIG. 14 is a cross-section view of the elements of FIG. 12 with the nickel plating and copper layer having been etched through at the pattern in the first layer of photoresist and the first layer of photoresist then removed.

Referring to FIG. 11, a layer of nickel 30 is plated or otherwise deposited onto the copper layer 96. As illustrated in FIGS. 12-14, a first layer 106 of photoresist 104 is placed atop the nickel 30 and a pattern 108 is formed therein. While only one space of the pattern 108 is shown, it may be understood that this is a close-up view showing only a small portion of the elements, so that in reality a number of patterned areas may be formed in the first layer 106 of photoresist 104. The nickel plating 30 and copper layer 96 are then fully etched down to the dielectric layer 12 at the pattern 108 and then the first layer 106 of photoresist 104 is removed, as seen in FIG. 14.

Figure 15:
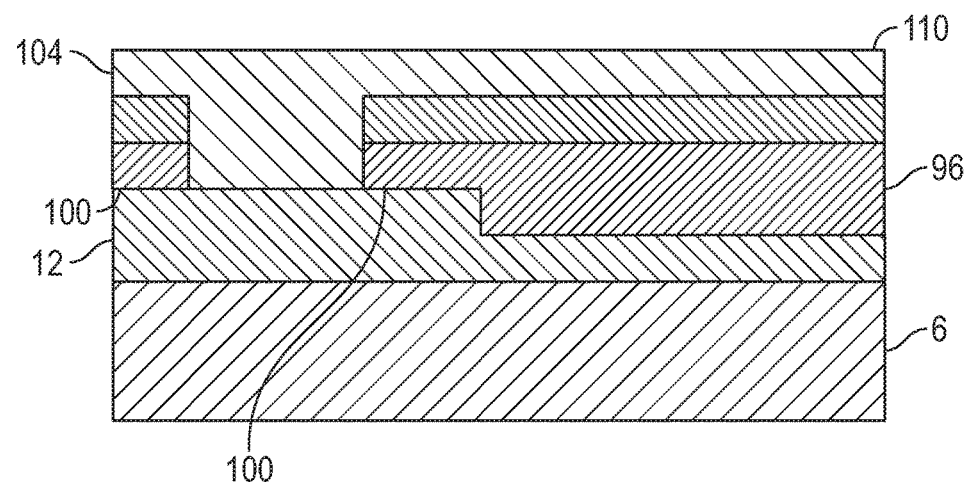
FIG. 15 is a cross-section view of the elements of FIG. 14 with a second layer of photoresist placed thereon.
Figure 16:
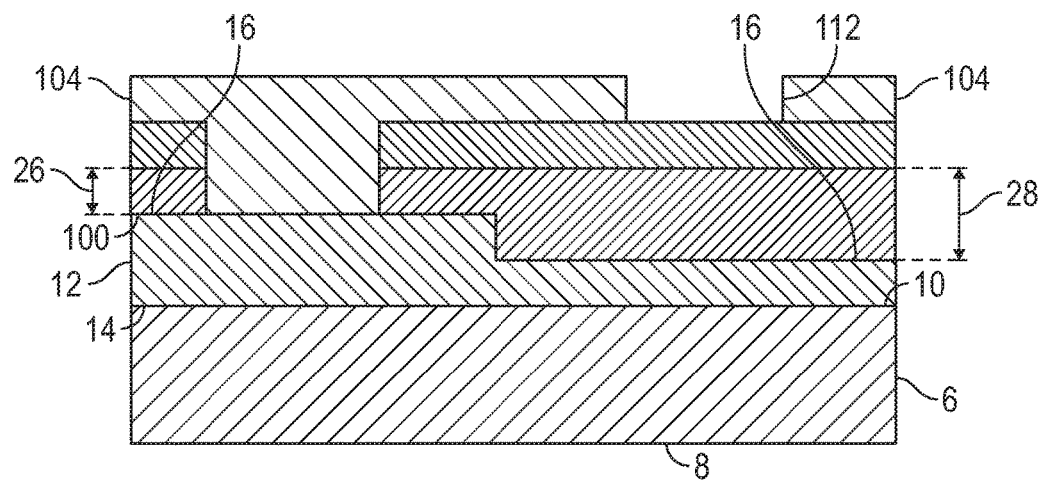
FIG. 16 is a cross-section view of the elements of FIG. 15 with a pattern formed in the second layer of photoresist.

A second layer 110 of photoresist 104 is then coated onto the elements as shown in FIG. 15 and a second pattern 112 is formed therein. Although only a single space of the pattern 112 is shown, it may be understood that a number of spaces may be formed therein. The nickel layer 30 and copper layer 96 are then fully etched through down to the dielectric layer at the pattern 112 to form the traces 20 and the second layer 110 of photoresist 104 is removed. Some of the traces 20 have the first thickness 26 and some have the second thickness 28—and in the implementation shown some have both the first thickness 26 and second thickness 28.

It may be perceived that a slightly modified version of this process may be used to form IMS 34 illustrated in FIG. 2, wherein the step of adding the nickel 30 is unnecessary and the etching processes to form the traces 20 accordingly do not involve etching through the nickel 30. It may also be understood that the process could be slightly modified to form traces 20 of more than two thicknesses. By non-limiting example, layers of photoresist 104 could be coated onto the copper layer 96 shown in FIG. 8, a pattern formed therein, and an etching process may then be used to etch a second pattern into the copper layer 96, which if etched to a different depth in the copper layer 96, may be used to form a third thickness in the copper layer 96 different than the first thickness 26 and second thickness 28. This process could be repeated numerous times to form many thicknesses in the copper layer 96. This may be done with the second surface 16 of the copper layer 96 remaining flat and, accordingly, the remaining process steps are identical or fairly identical to those described previously.

Figure 19:
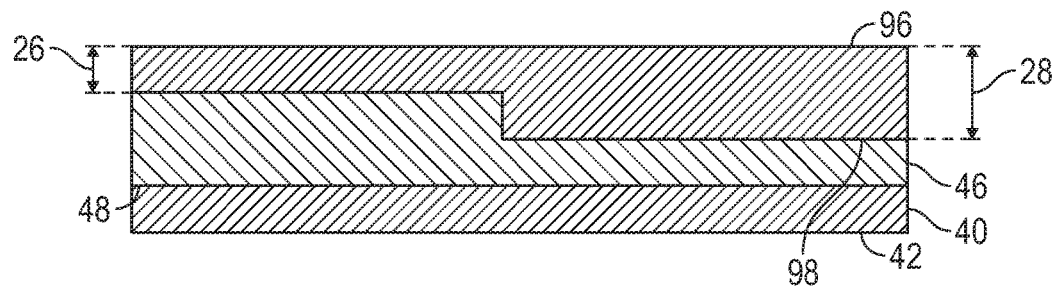
FIG. 19 is a cross-section view of the elements of FIG. 18 coupled together.
Figure 20:
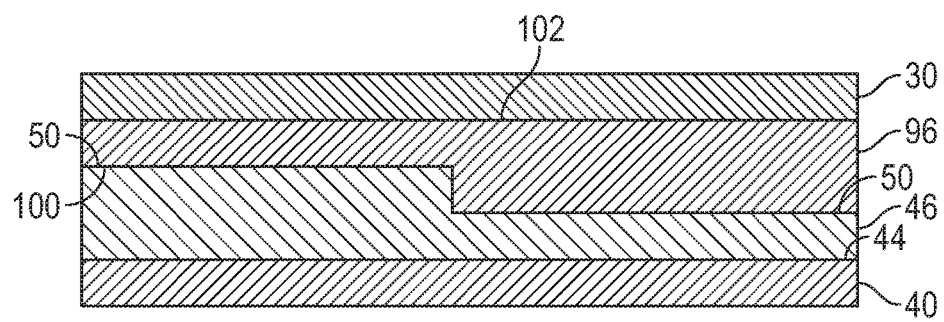
FIG. 20 is a cross-section view of the elements of FIG. 19 with a layer of nickel plated onto the copper layer.
Figure 21:
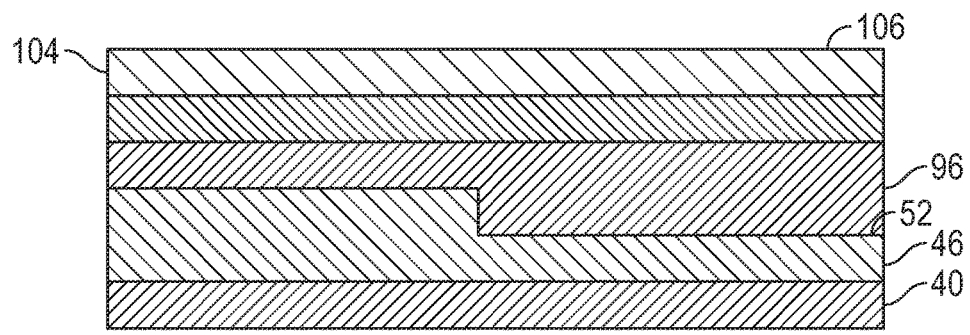
FIG. 21 is a cross-section view of the elements of FIG. 20 with a first layer of photoresist placed atop the nickel plating.
Figure 22:
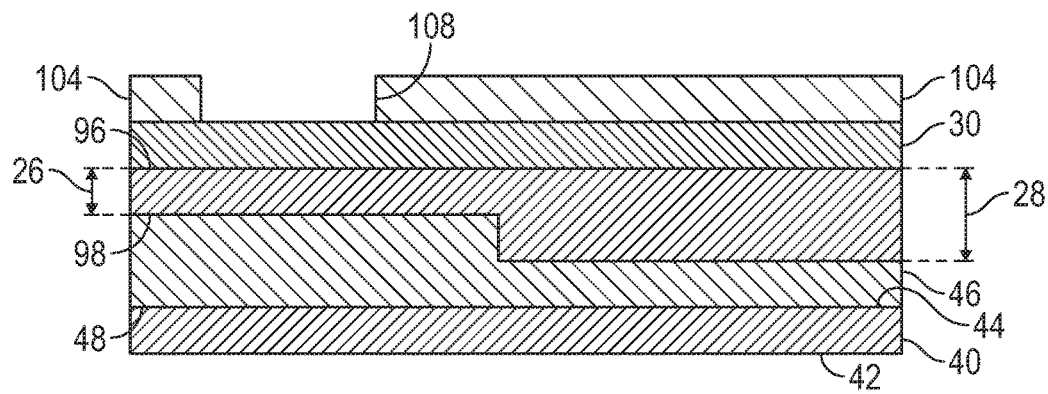
FIG. 22 is a cross-section view of the elements of FIG. 21 with a pattern formed in the first layer of photoresist.
Figure 23:
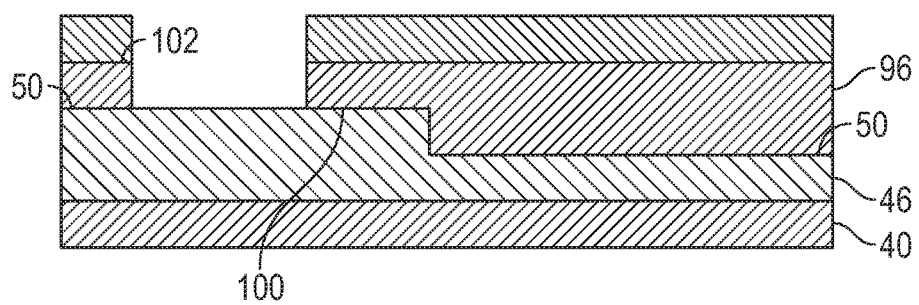
FIG. 23 is a cross-section view of the elements of FIG. 22 with the nickel and copper layers having been etched through at the pattern in the first layer of photoresist and the first layer of photoresist having being removed.

FIGS. 18-26 show a process of forming DBC substrate 38, which in some aspects is similar to the process described above for forming IMS 4, as it involves patterning a layer of copper as was previously described for use in subsequent processing. As A pattern 100 is formed in the first surface 98 of the copper layer 96 as already described in this document. With respect to shaping the ceramic layer, a pattern 52 is formed in the second surface 50 of the ceramic layer 46 which is complementary, or substantially complementary, to the pattern 100 in the copper layer 96. The pattern 52 in the ceramic layer 46 may be formed using any of a variety of techniques for etching or shaping ceramic materials, including photoresist masking and dry or wet etching, or through stamping/forming processes prior to the ceramic material being cured/dried/fired/sintered. As shown in FIG. 19, the copper layer 96, ceramic layer 46 and metallic baseplate 40 are bonded together through a sintering or other similar process used to form intermetallic or other bonding layers between the copper and the ceramic material. A layer of nickel 30 is coupled atop the copper layer 96, through electroplating or deposition as shown in FIG. 20, and atop this a first layer 106 of photoresist 104 is added as shown in FIG. 21. A pattern 108 is formed in the first layer 106, as shown in FIG. 22. As described above, although only a single space is formed there may be a plurality of spaces in the pattern 108. The nickel 30 and copper layer 96 are fully etched through at the gap 108, revealing the ceramic layer 46, and the first layer 106 of photoresist 104 is then removed, as illustrated in FIG. 23.

Figure 24:
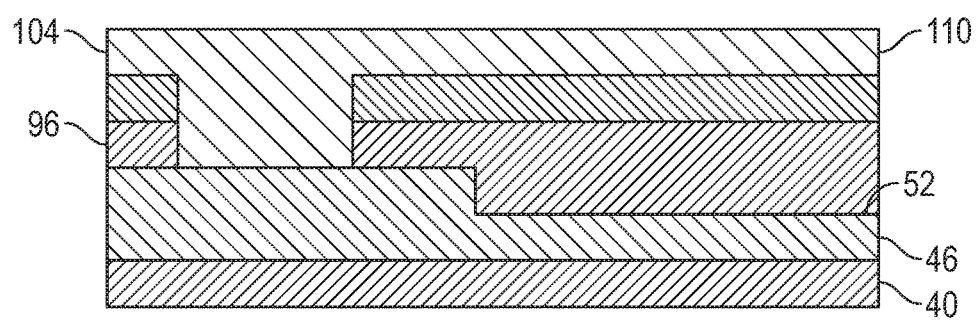
FIG. 24 is a cross-section view of the elements of FIG. 23 with a second layer of photoresist placed thereon.
Figure 25:
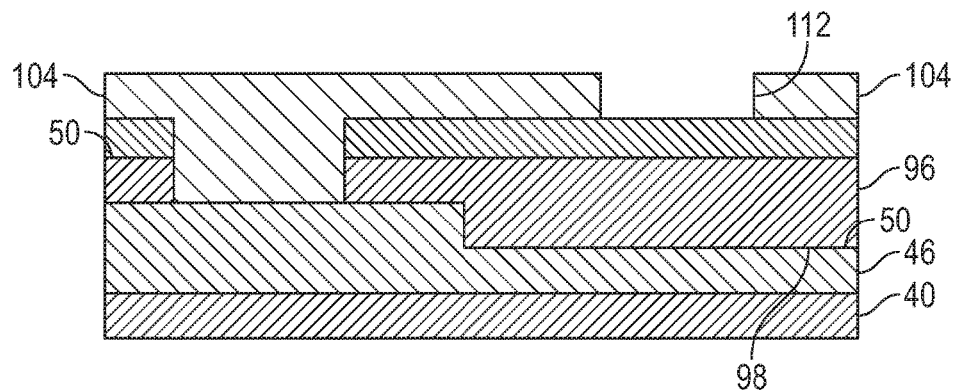
FIG. 25 is a cross-section view of the elements of FIG. 24 with a pattern formed in the second layer of photoresist.
Figure 26:
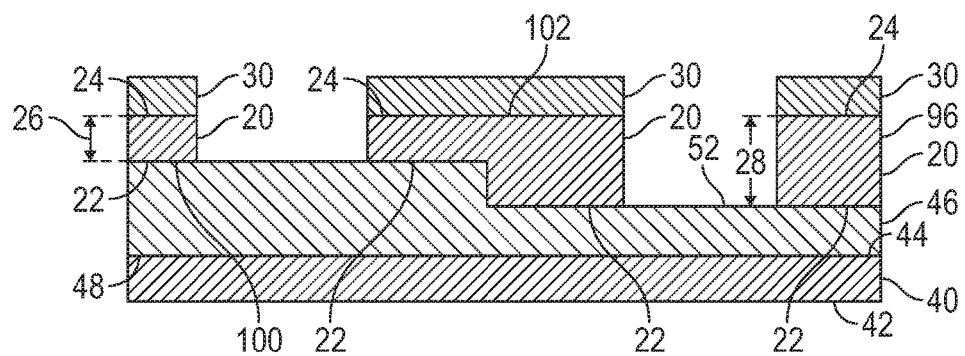
FIG. 26 is a cross-section view of the elements of FIG. 25 with the nickel and copper layers having been etched through at the pattern in the second layer of photoresist and the second layer of photoresist having been removed.

A second layer 110 of photoresist 104 is then added to the elements as shown in FIG. 24 and a pattern 112 is formed therein, as seen in FIG. 25. Again, there may be a plurality of spaces composed in the pattern 112. The nickel layer 30 and copper layer 96 are fully etched through at the pattern down to the ceramic layer 46 to form the traces 20, and the second layer 110 of photoresist 104 is removed. Some traces 20 have the first thickness 26 and some have the second thickness 28 and, if desired, the process may be used to form some traces 20 having both thicknesses, as illustrated in FIG. 26. As with other processes described above, there may be more than two trace thicknesses by making slight modifications to the process as described above with respect to the process for forming IMS 4 to shape the copper layer 96. A process for forming DBC substrate 56 may be similar in many respects to the process for forming DBC substrate 38 except that the nickel plating 30 is not included (and, accordingly, is not etched through).

Figure 27:
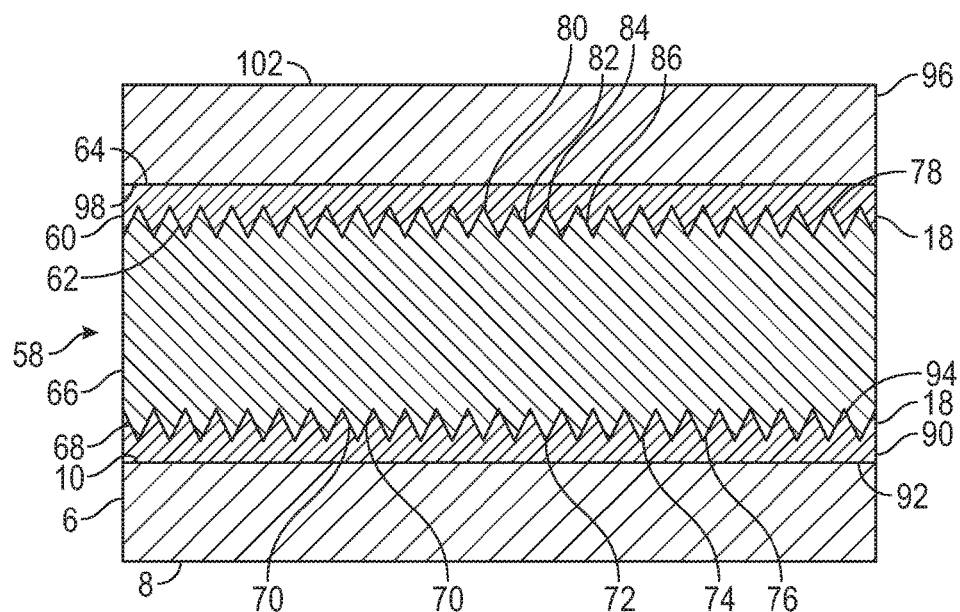
FIG. 27 is a cross-section close-up view a substrate implementation having a copper layer, a first dielectric layer, a ceramic layer, a second dielectric layer, and a metallic baseplate magnified.

FIG. 27 illustrates a power electronic substrate 58 that can be considered a hybrid as it has some elements similar to an IMS and some elements similar to a DBC substrate. A metallic baseplate 6 is used, having the first surface 8 and second surface 10 as previously described. There are two dielectric layers 60 and 90, and a ceramic layer 66 is sandwiched therebetween. The second dielectric layer 90 has a first surface 92, on an opposite side from a second surface 94, the first surface 92 being bonded to the second surface 10 of the metallic baseplate 6.

A first surface 68 of the ceramic layer 66 has a bonding pattern 70 thereon. This may include bonding ridges 72, conical projections 74, pyramidal projections 76, and the like dispersed on the first surface 68 of the ceramic layer. Other patterns and/or shapes may be employed to increase the surface area and/or the surface interaction between the ceramic layer 66 and the dielectric material. Referring to FIG. 27 (and the page on which the drawing is presented) the bonding pattern 70 may include a series of discrete elements that extend through the surface of the page (such as a grid or array of individual projections when viewed from above) and/or rows extending through the page surface. The second surface 94 of the second dielectric layer 90 receives the bonding pattern 70. This may be accomplished by the second dielectric layer 90 behaving as a fluid when it is being bonded to the ceramic layer 66 via a laminating or other pressure process inducing localized flow of the dielectric material to effectively form a pattern that is complementary, or substantially complementary, to the bonding pattern 70. The second dielectric layer 90 may be formed of an epoxy 18, and the bonding pattern 70 may assist the epoxy 18 to bond sufficiently to the ceramic layer 66.

A second surface 78 of the ceramic layer 66 opposite the first surface 68 also includes a bonding pattern 80, which may include any features or characteristics previously described with respect to bonding pattern 70, and may include bonding ridges 82, conical projections 84, pyramidal projections 86, and the like. Other patterns and/or shapes may be used. The first surface 62 of the first dielectric layer 60 receives the bonding pattern 80 and, accordingly, forms a complementary or substantially complementary pattern on the first surface 62. The first dielectric layer 60 may have any of the characteristics, features, and so forth of the second dielectric layer 90. A second surface 64 of the first dielectric layer 60, opposite the first surface 62, is bonded to a copper layer 96.

Figure 28:
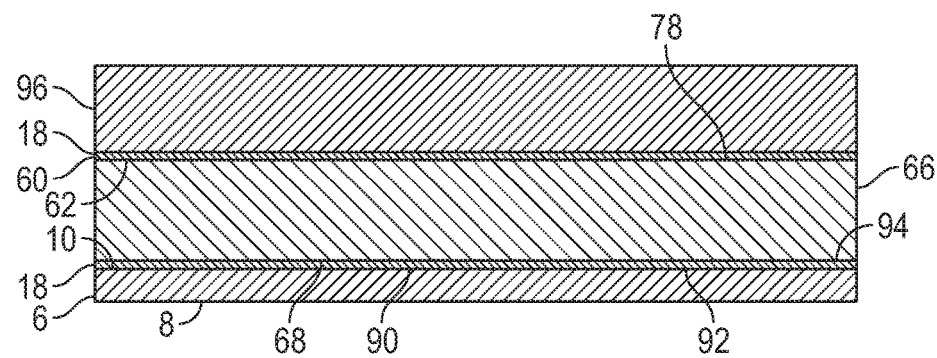
FIG. 28 is a cross-section view of the elements of FIG. 27 shown with less magnification.
Figure 29:
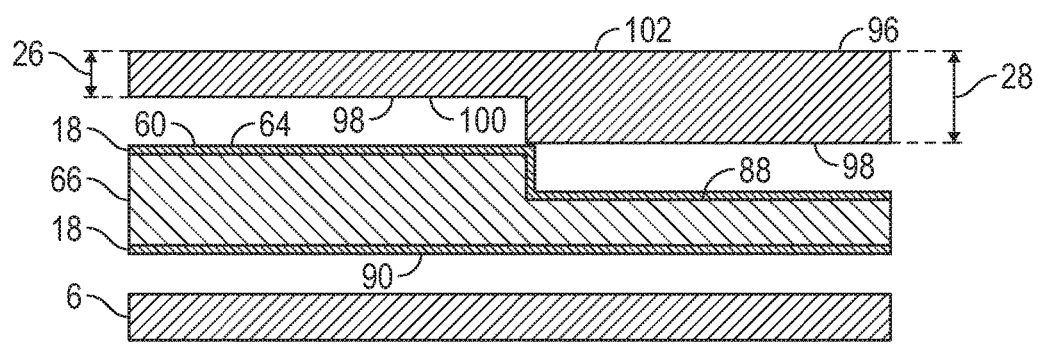
FIG. 29 is a cross-section view of the copper layer of FIG. 8 having a pattern thereon, a first dielectric layer, a ceramic layer having a pattern complementary to the copper layer, a second dielectric layer, and a metallic baseplate of a power electronic substrate prior to fully coupling the elements together.
Figure 30:
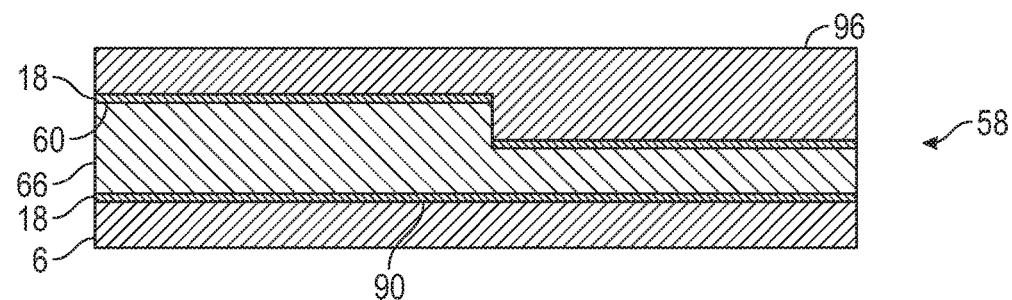
FIG. 30 is a cross-section view of the elements of FIG. 29 fully coupled together.

FIG. 28 is a view of the power electronic substrate 58 shown at a lesser degree of magnification so that the bonding patterns 70, 80 is not visible. Traces 20 may be formed in the copper layer 96 at this point, in a similar manner as described above with respect to other power electronic substrates. The power electronic substrate 58 may have a copper layer 96 (and accordingly, traces 20) of a uniform thickness, or the copper layer 96 may have a pattern 100 therein and the ceramic layer 66 may have a pattern 88 therein, as seen in FIGS. 29 and 30, that is complementary, or substantially complementary, to pattern 100 (and may be formed through etching processes as described herein) so that there will be traces 20 of varying thicknesses, which may be formed using techniques already described with respect to other power electronic substrates herein. In other implementations, however, the traces 20 may be formed without varying thicknesses.

In implementations of power electronic substrates disclosed herein which use an epoxy or resin for the dielectric layer, the dielectric layer may have a thickness from its first surface to its second surface of, or of about, 25 microns to, or to about, 300 microns. The epoxy or resin may include thermally conductive filler particles, such as by non-limiting example $SiO_2$, $Al_2O_3$, BN, or the like, dispersed therein. Copper layers described herein may be copper foil and may have, by non-limiting example, thicknesses ranging from, or from about, 18 microns to, or to about 200 microns, or greater. In implementations in which the metallic baseplates are formed of aluminum they may have an alumite and/or anodized aluminum layer on the first and second surfaces. Some metallic baseplates may have, by non-limiting example, a thickness from the first surface to the second surface of, or of about, 1.5 mm.

In implementations herein in which a ceramic layer is used the ceramic layer may include, by non-limiting example, alumina, aluminum nitride, and other high thermally conductive ceramic or composite materials. A copper layer may be directly bonded to a ceramic layer using a high-temperature oxidation process wherein the copper and ceramic are heated to a controlled temperature in a nitrogen atmosphere containing about 30 ppm of oxygen (or about 1.5% concentration of $O_2$ in atom percentage) to form a copper-oxygen eutectic which bonds both to the copper and to an oxide of the ceramic layer. In implementations the ceramic layer may be $Al_2O_3$ and a thin layer of copper-aluminum-spinel may bond the copper layer to the ceramic layer. In implementations the ceramic layer may be aluminum nitride and a thin layer of copper-aluminum-nitride may be formed by first oxidizing the surface of the aluminum nitride to form a layer of alumina by high temperature oxidation. In implementations a copper layer may be bonded to a ceramic layer using a sintering process. In particular implementations, the sintering process may involve melting or softening small particles comprised in each of the copper layer and the ceramic layer to bond them with adjacent small particles. By small in this process is meant microscopic particles.

The hybrid power electronic substrate 58 shown in FIGS. 27-30, due to the lack of a direct copper-to-ceramic bond, eliminates the need for the high temperature bonding processes described above. In addition, because there is no need for a high temperature bonding or other sintering process, the substrate 58 including a ceramic layer can be formed using laminating or other pressure bonding processes.

Implementations of IMS panels prior to singulation may have sizes of, or of about, 1 square meter, and may have the form of a square or of a rectangle. Implementations of DBC substrate panels prior to singulation may be wafer-shaped and may have sizes of, or of about, 5 inches by 7 inches.

Implementations of power electronic substrates disclosed herein may be used, by non-limiting example, as substrates for insulated gate bipolar transistor (IGBT) power modules, intelligent power modules (IPMs), power integrated modules (PIMs), power metal-oxide-semiconductor field-effect-transistors (MOSFETs), and the like. In implementations terminals of a semiconductor package may be formed of the copper layers described herein. Packages formed using the power electronic substrates disclosed herein may include top leads, side leads, down leads, glass to metal seals, surface mounts, liquid cooling, and the like.

PIM products may use DBC substrates with thicker copper trace thicknesses while IPM products may use IMS substrates with thinner copper trace thicknesses. Thinner copper traces are better for fine line space for routing while thicker copper traces are better for thermal and electrical performance for power electronic devices. In implementations the power electronic substrates disclosed herein may allow both of these advantages to be realized on a single substrate. In such implementations the thicker copper traces are used for power lines for power electronics while the thinner copper traces may be used for the rest of the circuitry with fine line spacing, and/or for fine pitch circuitry, such as for one or more drivers. The use of some thinner copper traces may reduce overall substrate stress.

In particular implementations a leadframe of a power electronic device may be bonded to the top layer (copper or nickel) of a power electronic substrate described herein. This may be done, in implementations, using a solder, such as by non-limiting example an Sn/Ag/Cu solder.

As may be envisioned, the process of forming an IMS shown in FIG. 17 may be followed up by additional steps to form a stacked IMS. By non-limiting example, a second dielectric layer may be laminated over the traces (and nickel plating, if present) and a second copper layer (having a pattern therein, or not) may then be coupled to the second dielectric layer, with traces later formed in the second copper layer to form the stacked IMS for a power electronic, these later traces having, if desired, multiple thicknesses as previously described with respect to other traces.

Implementations of substrates disclosed herein may utilize principles disclosed in U.S. Pat. No. 7,078,797 listing as inventors Suzuki et al., issued Jul. 18, 2006, titled "Hybrid Integrated Circuit Device," the disclosure of which is hereby entirely incorporated herein by reference. Furthermore, forming ground connections to substrates as illustrated in that reference, such as, by non-limited example shown in FIG. 1B of that reference, may be incorporated into power electronic substrate designs disclosed herein. Forming such connections may be accomplished, by non-limited example, by etching or otherwise forming a through-hole through the dielectric material, ceramic layer, or other insulative layer during processing, using methods disclosed herein, and then coupling an electrical contact on a surface of a die to a grounded metallic baseplate using a wirebond or the like.

Furthermore, substrate implementations like those disclosed herein by use the principles disclosed in U.S. Pat. No. 7,102,211, listing as inventors Ochiai et al., issued Sep. 5, 2006, titled "Semiconductor Device and Hybrid Integrated Circuit Device," the disclosure of which is hereby entirely incorporated herein by reference. Implementations of power electronic substrates disclosed herein may be used to form hybrid integrated circuit (HIC) devices such as those disclosed in that reference. The "fused leads" of an HIC package as shown in that reference, such as by non-limiting example those shown in FIG. 6B (elements 54, 55) of that reference, may be formed of the same copper layer that is used to make the traces 20 described herein.

Substrate implementations like those may be formed employing the principles disclosed in U.S. Pat. No. 7,521,290, listing as inventors Takakusaki et al., issued Apr. 21, 2009, titled "Method of Manufacturing Circuit Device," the disclosure of which is hereby entirely incorporated herein by reference. The methods disclosed therein of attaching a leadframe to multiple substrates (or in other words to a single panel containing multiple non-singulated substrates prior to singulation), to then be singulated, such as by non-limiting example the elements shown in FIG. 3A of that reference, may be incorporated in and/or used together with power electronic devices disclosed herein.

Implementations of substrates like those disclosed herein may be formed using the principles disclosed in U.S. Pat. No. 7,935,899, listing as inventors Takukusaki et al., issued May 3, 2011, titled "Circuit Device and Method of Manufacturing the same," the disclosure of which is hereby entirely incorporated herein by reference. Furthermore, packaging multiple HIC substrates within a single package as disclosed in that reference, such as that shown by non-limiting example in FIG. 1B and described in the specification of that reference, may be accomplished in part by forming several power electronic substrates according to methods disclosed herein in a single panel and then singulating each individual power electronic substrate, such as through punch or saw singulation, and interconnecting die and other components between HIC modules as shown in FIG. 1B of that reference.

In various implementations of substrates disclosed herein, the principles disclosed in U.S. Pat. No. 8,448,842, listing as inventor Wu, issued May 28, 2013, titled "Advanced copper bonding (ACB) with ceramic substrate technology," may be employed, the disclosure of which is hereby entirely incorporated herein by reference. Any of the bonding techniques disclosed therein with respect to bonding copper layers to ceramic layers may be utilized in forming power electronic substrates disclosed herein including, by non-limiting example: forming a copper film having a thickness of less than 1 micron on a ceramic substrate by sputtering deposition under 0.00133 torr and 150 degrees Celsius; plating a copper layer of 10-50 microns at room temperature, and; bonding a copper foil to the ceramic substrate by diffusion bonding under environments of high temperature, vacuum, and negative pressure inertia gas or $H_2$ partial pressure. In implementations a copper layer may be bonded to an aluminum oxide ceramic layer using methods described herein by heating in a sintering furnace up to 1000 degrees Celsius (or higher, such as about 1060 to about 1080 degrees Celsius) to form the eutectic layer described previously. In implementations no sputtering of copper onto a ceramic layer is needed to form the copper layer.

Implementations of substrates disclosed herein that include a nickel layer may employ the methods and principles disclosed in U.S. Pat. No. 7,936,569, listing as inventors Takakusaki et al., issued May 3, 2011, titled "Circuit Device and Method of Manufacturing the same," the disclosure of which is hereby entirely incorporated herein by reference. Furthermore, any of the elements therein describing nickel plating over copper traces, heat sink elements, and other elements used when attaching a die to a copper trace and/or electrically coupling an electrical contact on the die with one or more traces, such as by non-limiting example the elements shown in FIG. 1C of that reference and related description in the specification thereof, may be incorporated and/or used together with power electronic substrates disclosed herein. Additionally, insulating layers and/or dielectric layers described herein may include any of the elements, characteristics, features and the like of resins and/or insulating layers described in U.S. Pat. No. 7,936,569.

Implementations of substrates like those disclosed herein may employ the principles disclosed in Japan Patent Application Publication No. JP-2006-237561, listing as inventors Takakusaki et al., published Sep. 7, 2006, titled "Circuit Device and its Manufacturing Process," the disclosure of which is hereby entirely incorporated herein by reference. Furthermore, any of the elements therein that disclose nickel plating over copper traces, heat sink elements, and other elements used when attaching a die to a copper trace and/or electrically coupling an electrical contact on the die with one or more traces, such as by non-limiting example the elements shown in FIG. 1C of that reference and related description in the specification thereof, may be incorporated and/or used together with power electronic substrates disclosed herein. Additionally, insulating layers and/or dielectric layers described herein may include any of the elements, characteristics, features and the like of resins and/or insulating layers described in U.S. Pat. No. 7,936,569 previously incorporated by reference.

Implementations of substrates like those disclosed herein may be manufactured using the principles disclosed in Japan Patent Application Publication No. JP-2008-022033, listing as inventors Mizutani et al., published Jan. 31, 2008, titled "Hybrid Integrated Circuit Device," the disclosure of which is hereby entirely incorporated herein by reference. Furthermore, any of the v-score techniques applied to the substrates as disclosed therein in at least FIGS. 6-8 and 10, and related disclosure in the specification thereof, may be applied to and/or used with power electronic substrates disclosed herein to aid with singulation. In implementations such v-scores may be applied to the metallic baseplates described herein. In implementations double v-scores may be utilized wherein a plurality of v-scores are on an underside of the metallic baseplate and a corresponding plurality of v-scores are on the upper side of the metallic baseplate and aligned with the v-scores on the underside of the metallic baseplate to aid with singulation.

In places where the description above refers to particular implementations of substrate structures and methods of manufacture and implementing components, sub-components, methods and sub-methods, it should be readily apparent that a number of modifications may be made without departing from the spirit thereof and that these implementations, implementing components, sub-components, methods and sub-methods may be applied to other substrate structures and methods of manufacture.

What is claimed is:

1. A method of forming an insulated metal substrate (IMS) for a power electronic, comprising:
    partially etching a first surface of a copper layer to form a pattern comprising a first thickness and a second thickness greater than the first thickness, the first thickness and the second thickness both measured perpendicular to a second surface of the copper layer opposite the first surface of the copper layer;
    laminating the first surface of the copper layer with a second surface of a dielectric layer, the dielectric layer coupled to a metallic baseplate at a first surface of the dielectric layer opposite the second surface of the dielectric layer and at a second surface of the metallic baseplate; and
    forming traces in the copper layer by etching through the copper layer at the first thickness and etching completely through the copper layer at the second thickness, wherein the traces comprise two different trace thicknesses, where the trace thicknesses are measured perpendicularly to the first surface of the dielectric layer.

2. The method of claim 1, wherein forming the pattern further comprises forming a third thickness different in magnitude from the first thickness and the second thickness, the third thickness measured perpendicular to the first surface of the dielectric layer.

3. The method of claim 1, further comprising plating a layer of nickel onto the second surface of the copper layer, and wherein forming the traces in the copper layer further comprises etching through the layer of nickel.

4. The method of claim 1, wherein etching through the copper layer at the first thickness and etching through the copper layer at the second thickness comprises coupling a first layer of photoresist to the second surface of the copper layer, forming a pattern in the first layer of photoresist, etching through the copper layer at the first thickness at spaces in the pattern in the first layer of photoresist, removing the first layer of photoresist, coupling a second layer of photoresist to the second surface of the copper layer, forming a pattern in the second layer of photoresist, etching through the copper layer at the second thickness at the spaces in the pattern in the second layer of photoresist, and removing the second layer of photoresist.

5. The method of claim 1, further comprising laminating the traces in the copper layer with a second dielectric layer, coupling a second copper layer to the second dielectric layer, and forming traces in the second copper layer to form a stacked IMS for a power electronic.

* * * * *